United States Patent
Figoli

(10) Patent No.: US 7,362,152 B2
(45) Date of Patent: Apr. 22, 2008

(54) APPARATUS AND METHOD FOR DIGITAL PHASE CONTROL OF A PULSE WIDTH MODULATION GENERATOR FOR MICROPROCESSOR/DSP IN INTEGRATED CIRCUITS

(75) Inventor: David A. Figoli, Missouri City, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/071,027

(22) Filed: Mar. 3, 2005

(65) Prior Publication Data

US 2005/0213654 A1   Sep. 29, 2005

Related U.S. Application Data

(60) Provisional application No. 60/555,891, filed on Mar. 24, 2004.

(51) Int. Cl.
*H03K 3/017*   (2006.01)

(52) U.S. Cl. .................................. 327/172; 327/175

(58) Field of Classification Search ........ 327/172–176, 327/178; 323/282; 331/57; 341/51, 155; 363/39, 41, 98; 375/238
See application file for complete search history.

(56) References Cited

U.S. PATENT DOCUMENTS

| 5,499,177 | A  | * | 3/1996  | Ichihara ........................ 363/37 |
| 2004/0230347 | A1 | * | 11/2004 | Sakurai et al. ................. 701/1 |
| 2005/0089090 | A1 | * | 4/2005  | Ringe et al. ................. 375/238 |

* cited by examiner

*Primary Examiner*—Linh My Nguyen
(74) *Attorney, Agent, or Firm*—William W. Holloway; W. James Brady; Frederick J. Telecky, Jr.

(57) ABSTRACT

In a digital pulse width modulation generator unit, a phase register is coupled to the clocked counter providing the generator unit time base. In response to a control signal, the contents of the phase register over-write the present counter, thereby changing the phase of pulse width modulated generator output signal. When a plurality of pulse width modulated generator units, the phases of the units can be controlled relative to a reference generator. The contents of the phase register can be altered by hardware or by software.

18 Claims, 8 Drawing Sheets

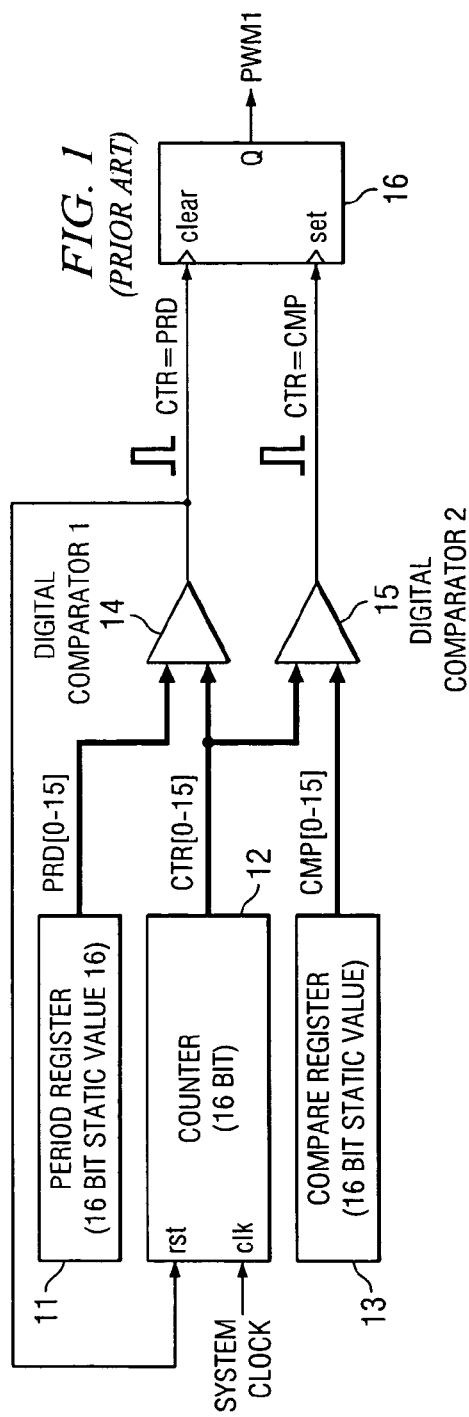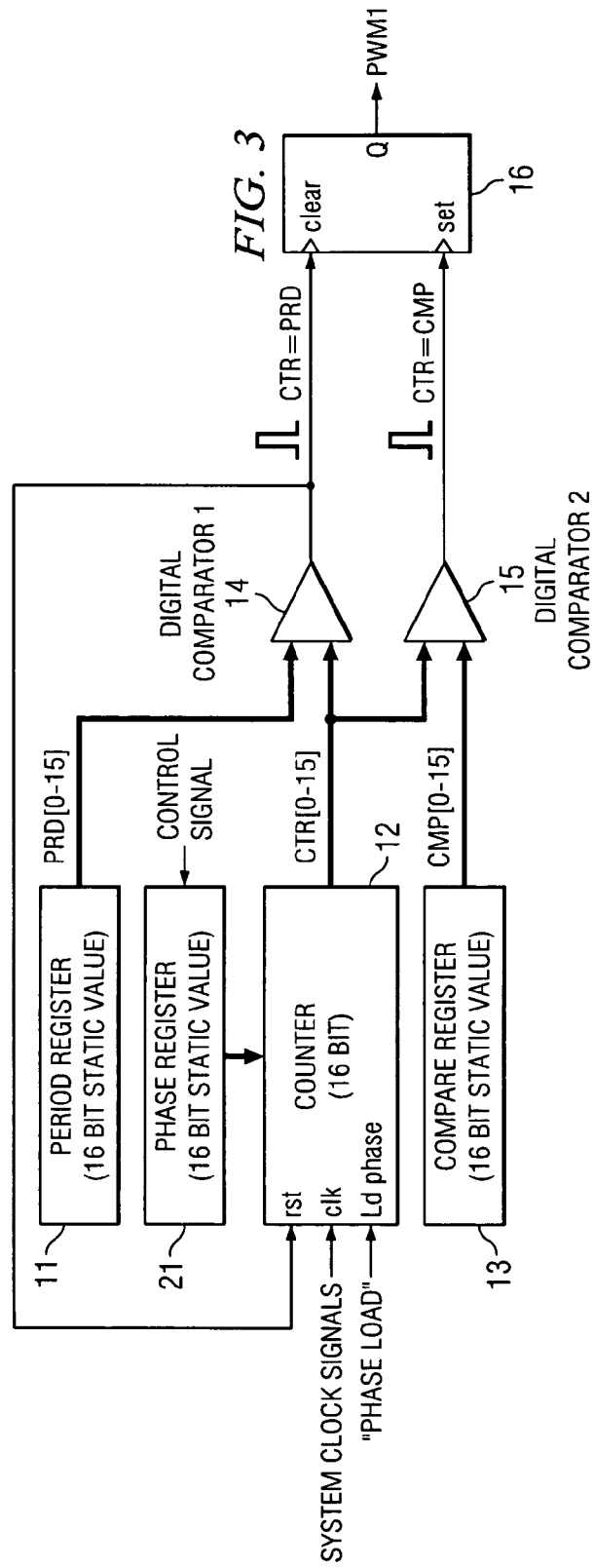

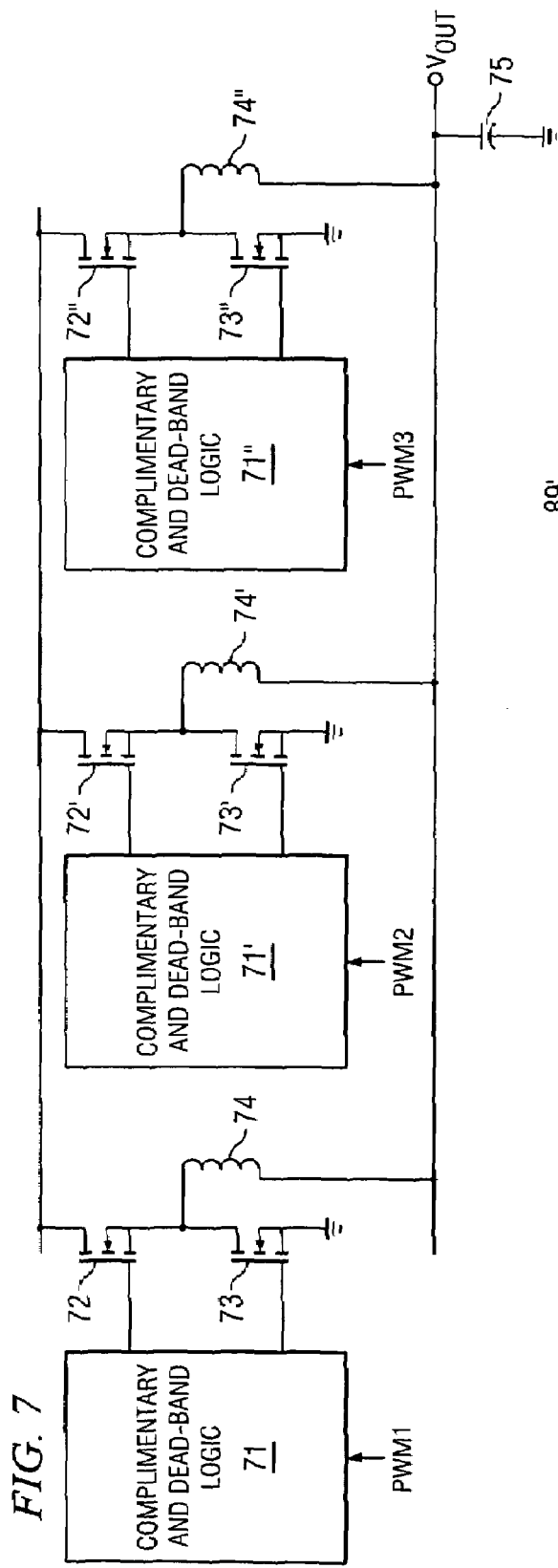
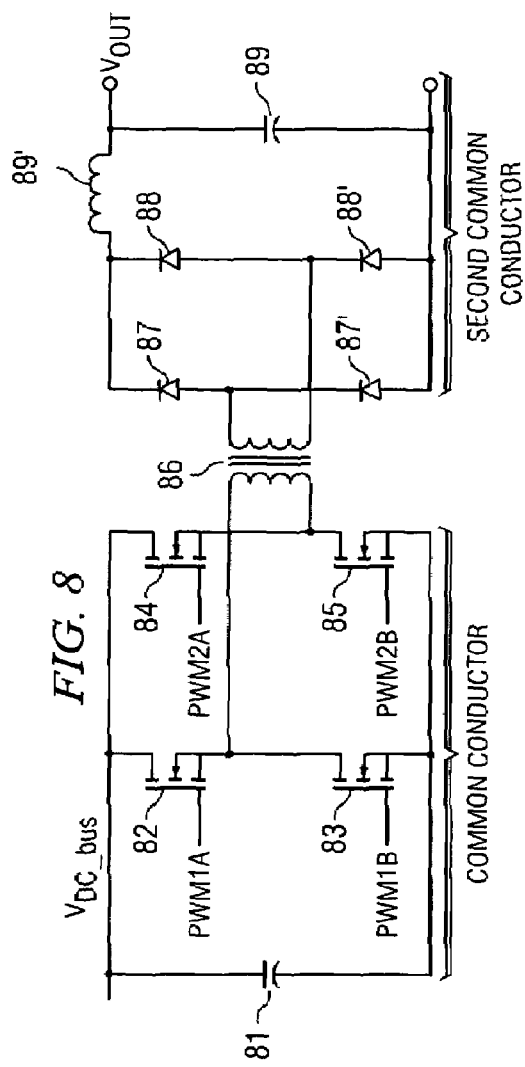
FIG. 7
FIG. 8

APPARATUS AND METHOD FOR DIGITAL PHASE CONTROL OF A PULSE WIDTH MODULATION GENERATOR FOR MICROPROCESSOR/DSP IN INTEGRATED CIRCUITS

This application claims priority under 35 USC §119(e)(1) of Provisional Application No. 60/555,891 (TI-38163PS) filed Mar. 24, 2004.

BACKGROUND OF THE INVENTION

1. Field of the Invention

This invention relates generally to data processing systems and, more particularly, to the regulation of power in integrated circuits using pulse width modulation (PWM) techniques.

2. Background of the Invention

Pulse width modulation techniques are an essential part of the control of many of the power related systems found in both commercial and industrial equipment. The main application areas include digital motor control, digital switch mode power supply control, uninterruptible (UPS) power supplies, and other forms of power conversion.

Although duty cycle control adjustment is one of the most commonly used PWM control methods, phase adjustment between a plurality of PWM channels is important in many power supply applications. The PWM phase relationship is important in two power supply categories, multi-phase power applications and resonant switch full bridge applications.

In the multi-phase power applications, a constant phase relationship is established between PWM channels prior to operation of the power stage. Power delivery is then controlled by duty cycle adjustment. The ability to be able to dynamically reconfigure a number of phases (depending on load and other parameters) becomes increasingly important. The phase relationship must be re-configured on-the-fly depending on system conditions.

With respect to the resonant switched full bridge applications the duty cycle remains essentially constant, while the power delivery is controlled entirely by the phase relationship between PWM channels. The phase adjustment occurs at very high up-date rates which in many cases can equal the PWM switching frequency.

Referring to FIG. 1, a PWM generator according to the prior art is shown. Period register 11 applies an output signal to a first input terminal of comparator 14, while counter 12 applies output signals to a second input terminal of comparator 14 and to a first input terminal of comparator 15. The compare register 13 applies output signals to a second input terminal of comparator 15. The output signal of comparator 14 is applied to the clear terminal of Q flip-flop 16 and to the reset terminal of counter 12, while the output terminal of comparator 15 is applied to the set terminal of Q flip-flop 16. The system clock signal is applied to the clock terminal of counter 12. The Q terminal of Q flip-flop 16 provides the PWM signal, i.e., the signal controlling the activation of the power components.

The operation of FIG. 1 can be understood by reference to FIG. 2, the waveforms for circuit shown in FIG. 1. The counter 12 (providing the system time base) is activated by the system clock, typically at 20–100 MHz, and counts upward. The count value is transmitted over a 16 bit bus (CTR[0–15]) to the comparators. Comparator 14 provides a comparison to period register and determines the PWM period, i.e., the frequency of the operation. The output signal of comparator 14 reset the counter when the COUNTER VALUE equals the PERIOD VALUE. Comparator 15 provides a comparison of the counter 12 value with the compare register 13. The output signal of comparator 15 sets the duty cycle when COUNTER VALUE equals COMPARE REGISTER VALUE. These two events drive CLEAR/SET logic to generate the PWM waveform shown in FIG. 2. The ramp waveform is a virtual one and only represents the upward counting vales of counter 12 over time. The Y-axis represents the counter 12 value while the x-axis represents time.

A need has therefore been felt for apparatus and an associated method having the feature that the phase adjustment in a PWM system is accomplished under software control. It would be yet another feature of the apparatus and associated method to provide a phase control register, the phase value (lag or lead) being written to the phase control register. It would be a still further feature of the present invention to incur relatively little software overhead when performing the phase adjustment. It would be a still further feature of the apparatus and associated method to update the phase at the end of each PWM cycle, thereby avoiding transitory glitches. It would be yet another feature of the apparatus and associated method to provide non-software dependent, reliable synchronizing mechanism that "re-locks" PWM channels to the programmed phase control register value every PWM cycle. It would be yet a further feature of the apparatus and associated method to support a friendly programmer interface/model with a microprocessor or DSP. It would be still further feature of the apparatus and associated method to support both up-count (asymmetrical) PWM applications and up/down count (symmetrical) PWM applications.

SUMMARY OF THE INVENTION

The foregoing and other features are accomplished, according the present invention, by coupling a phase register to the time base counter (i.e., counting system clock signals) in all the PWM generator units except for the generator unit providing the reference time base. The phase register is loaded periodically with a count that over-writes the count in the counter. In this manner, the phases of all the non-reference PWM generator output signals can be adjusted with respect to the reference PWM generator output signal. By locking the loading of the counter by the phase register to a selected point of the reference PWM generator output signal, the phase relationship can be reinforced. The present invention can be applied to multi-phase interleaved power stage and to zero voltage switched full bridge power stage. The contents of the phase register can be under hardware or software control.

Other features and advantages of present invention will be more clearly understood upon reading of the following description and the accompanying drawings and the claims.

BRIEF DESCRIPTION OF THE DRAWINGS

FIG. 1 is block diagram of a PWM generator according to the prior art.

FIG. 3 is a block diagram of a PWM generator with phase support according to the present invention.

FIG. 7 illustrates the application of the three-phase PWM generator system in a three-phase interleaved power stage.

FIG. 8 illustrates the application of PWM generator circuits to a zero voltage switched full bridge system.

DESCRIPTION OF THE PREFERRED EMBODIMENT

1. Detailed Description of the Figures

Figure 2:
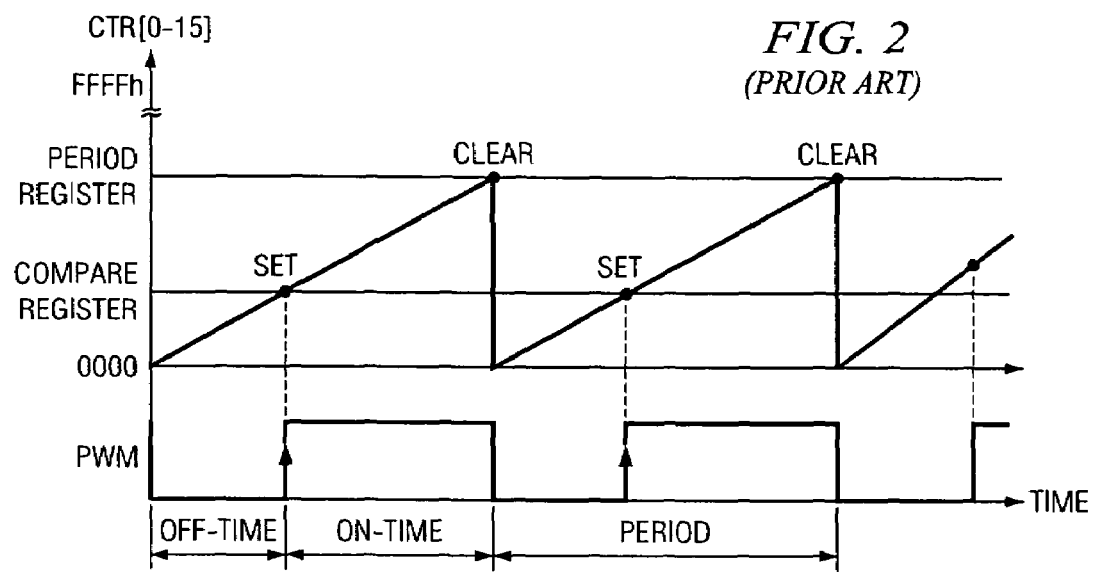
FIG. 2 illustrates the waveforms provided by the PWM generator shown in FIG. 1.

FIGS. 1 and 2 have been described with respect to the related art.

Digital phase control can be provided to the PWM generator shown in FIG. 1 by adding a mechanism to change asynchronously the contents of the counter 12 to a predetermined value. The contents of counter 12 can be changed by clocking (i.e., asynchronously loading) the contents of a register with a preset value (i.e., a phase value) thereby over-writing the counter 12 current value. Referring now to FIG. 3, a block diagram of a PWM generator with phase control support is shown. FIG. 3 is similar to FIG. 1. However, to components illustrated in FIG. 1 a phase register 21 applies signals to counter 12. In addition, a PHASE LOAD signal can be applied to a ld phase terminal of counter 12.

Figure 4:
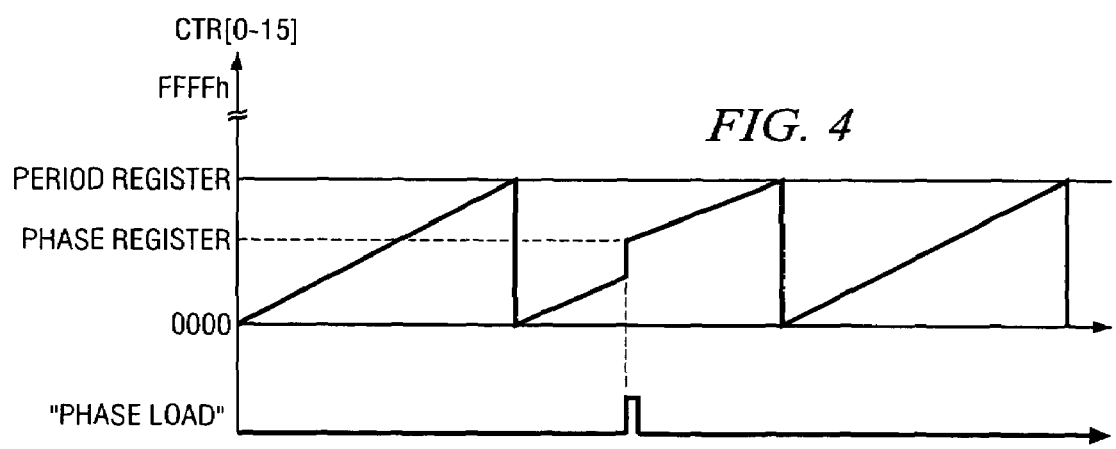
FIG. 4 illustrates the waveforms of the PWM generator illustrated in FIG. 3.

Referring to FIG. 4, the effect of a LOAD PHASE signal on the waveforms of the PWM generator of FIG. 3 is shown. Of particular interest is that by overwriting the number in the counter 12, the phase of the resulting PWM signal will be altered. The result arises from the arrival at the set point in advance of the unperturbed periodic signal generation.

Figure 5A:
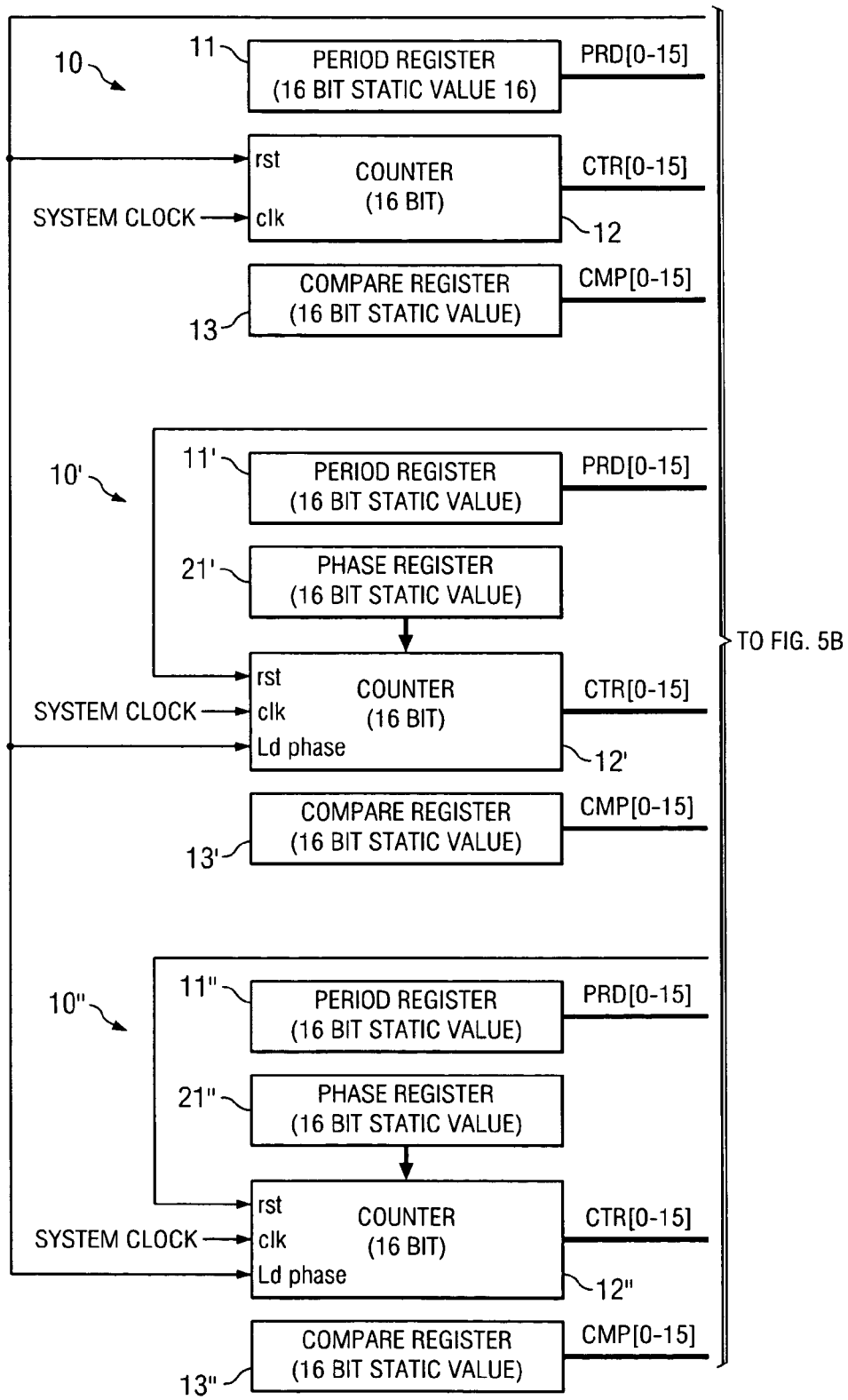
FIG. 5A–B illustrates a multi (3)-phase PWM generator with phase control according to the present invention.
Figure 5B:
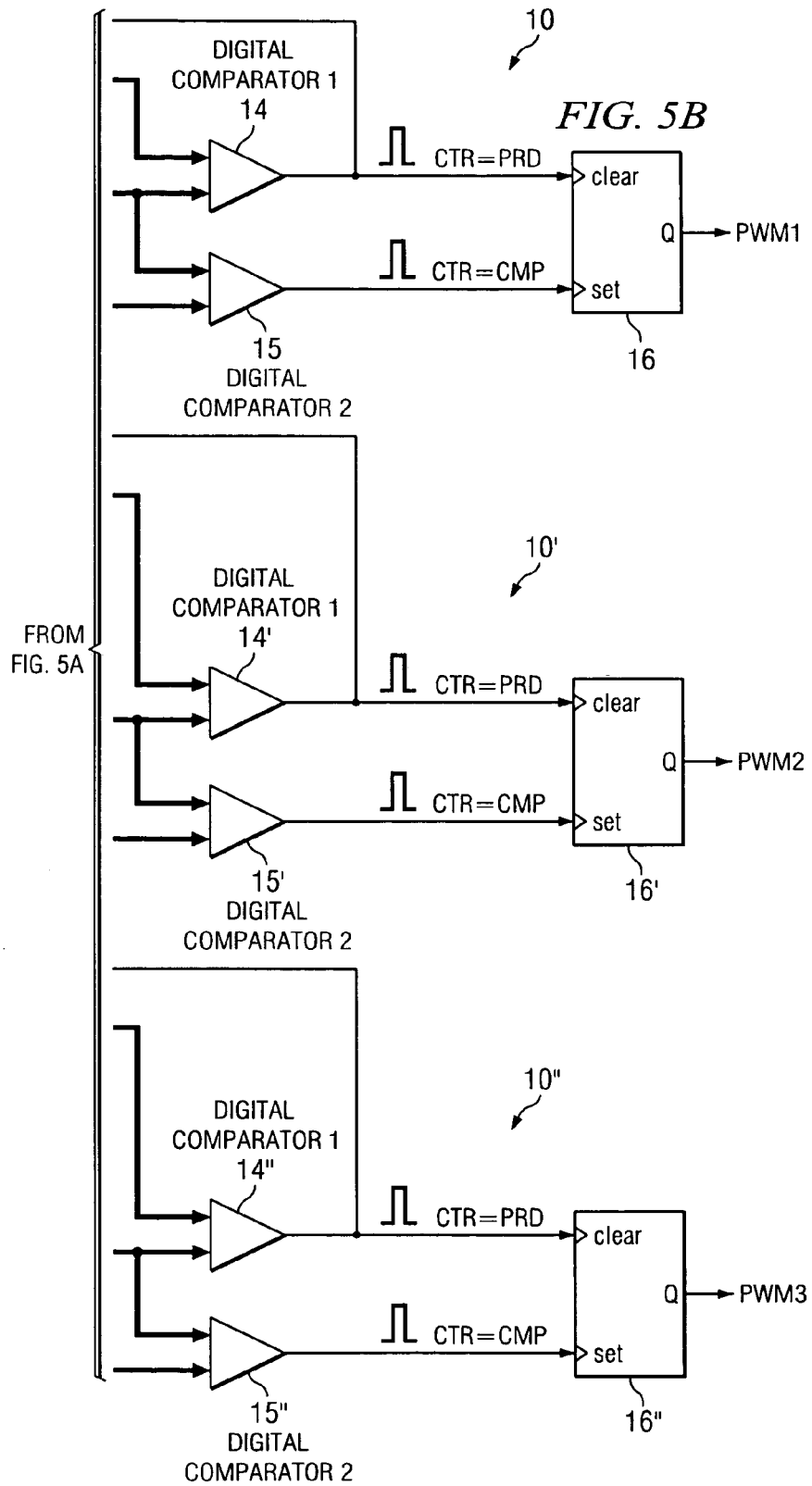

Referring to FIG. 5, a 3-phase PWM generator system is shown according to the present invention. Three PWM generators, 10, 10' and 10", as configured as in FIG. 3, form the generator system. PWM generator 10 does not have a phase register associated therewith. PWM generator 10' has phase register 21' coupled to counter 12'. PWM generator 10" has a phase register 21" coupled to comparator 12". The output signal of comparator 10 (PWM generator 10) is applied to the reset terminal of counter 12 (PWM generator 10), to the load phase terminal of counter 12' (PWM generator 10'), and to the load phase terminal of counter 12" (PWM generator 10").

Figure 6:
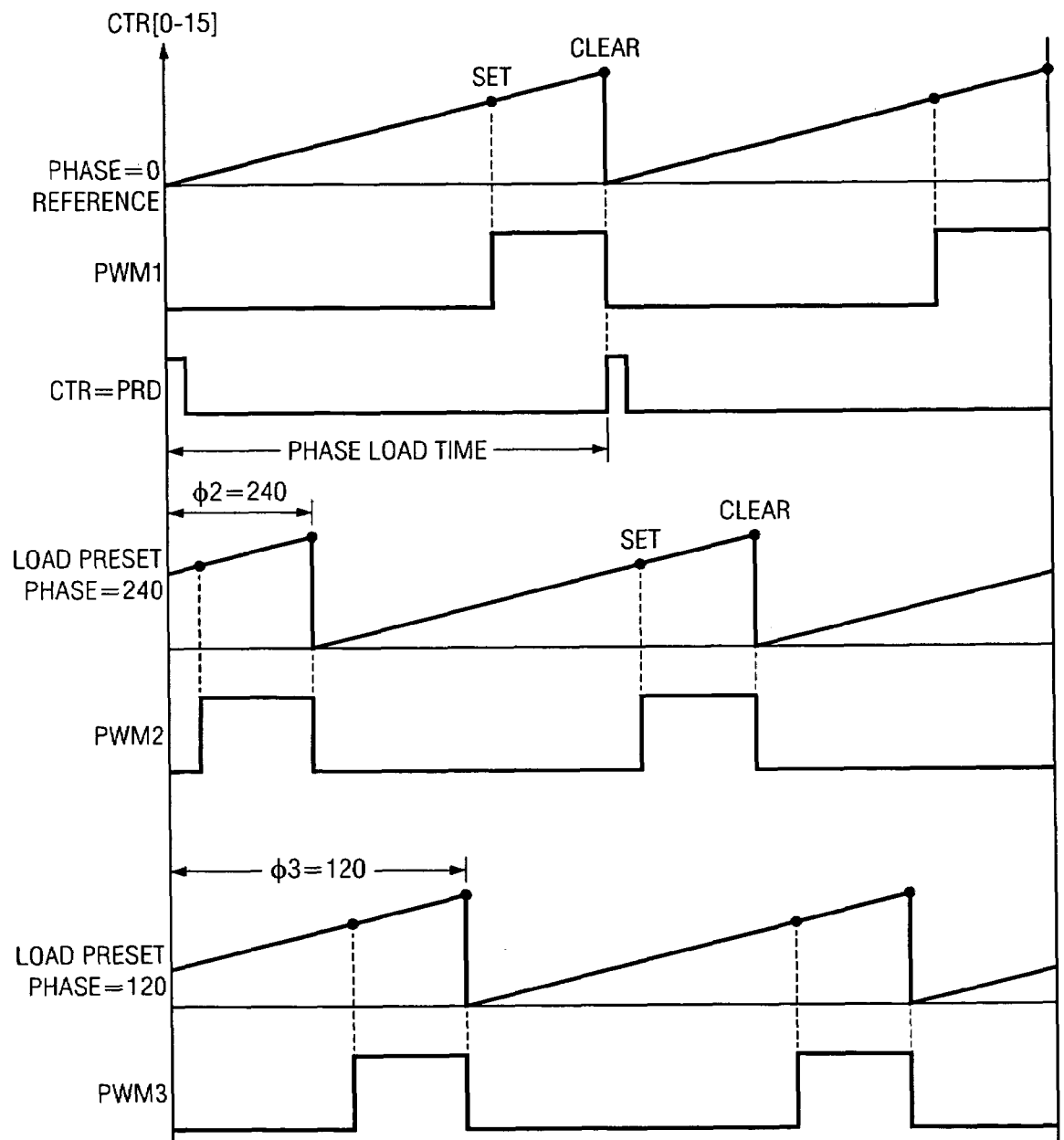
FIG. 6 illustrates the timing diagrams and PWM waveforms of the PWM generator as shown in FIG. 5.

The operation of PWM generator system shown in FIG. 5 can be understood by reference to FIG. 6. PWM generator 10 generates the reference phase signal PWM1. Therefore, no phase adjustment is needed. With respect to the PWM2 signal of PWM generator 10', the phase of this signal is 240° out of phase with the PWM1 signal. With respect to the PWM3 signal, this signal is 120° out of phase with the PWM1 signal. Therefore, the phase register is loaded with a value that causes the count in the counter to be switched to a point on the PWM generator 10" counter 12' output signal that is 240° out of phase with PWM generator 10 counter 12 output signal of PWM generator. Similarly, the PWM generator 10" counter 12" output signal to be switched to a point that is 120° out of phase with the counter 10 output signal. Consequently, the resulting PWM2 signal will be 240° out of phase with the PWM1 signal and the PWM3 signal will be 120° out of phase with the PWM1 signal. Notice that the periodic load signal will reinforce the phase relationship each cycle.

Referring to FIG. 7, an implementation of a 3-phase interleaved power stage using the techniques of the present invention is shown. The complementary dead-band logic units 71, 71' and 71" receive PWM1 signals, PWM2 signals, and the PWM3 signals, respectively. The complementary dead-zone logic units 71, 71' and 71" apply signals to the gate terminals of FET transistors 72 and 73, to the gate terminals of FET transistors 72' and 73', and to the gate terminals of FET transistors 72" and 73", respectively. Each FET transistor pair 72 and 73, 72' and 73', and 72" and 73" are coupled in series between a common terminal and a ground terminal. The common terminal of the 72–73 transistor pair, of the 72'–73' transistor pair and of the 72"–73" transistor pair are coupled through inductors 74, 74' and 74", respectively to the Vout terminal. The Vout terminal is coupled through capacitor 75 to the ground potential.

Referring to FIG. 8, a block diagram of a power stage for a zero voltage switched full bridge system (hereinafter referred to as a ZVSFB system) is illustrated. A $V_{DC\text{-}bus}$ conductor is coupled through capacitor 81 to a common conductor, through FET transistor 82 to a first input terminal of transformer 86, and through FET transistor 84 to a second input terminal of transform 86. The first input terminal of transformer 86 is coupled through FET transistor 83 to the common conductor, while the second input terminal of transformer 86 is coupled through FET transistor 85 to the common conductor. A Vout terminal is coupled through capacitor 89 to a second common terminal and through inductor 89' to the cathode of diode 88 and to the cathode of diode 87. The anode terminal of diode 87 is coupled to a first output terminal of transformer 86 and the cathode terminal of diode 87'. The anode terminal of diode 88 is coupled to second output terminal of transformer 86 and to a cathode terminal of diode 88'. The anode terminal of diode 87' and the anode terminal of diode 88' are coupled to the second common conductor. The PWM1A signal is applied to the gate circuit of FET transistor 82, while the PWM1B signal is applied to the FET transistor 83. The PWM2A signal is applied to the gate of transistor 84, while the PWM2B signal is applied to FET transistor 85.

Figure 9:
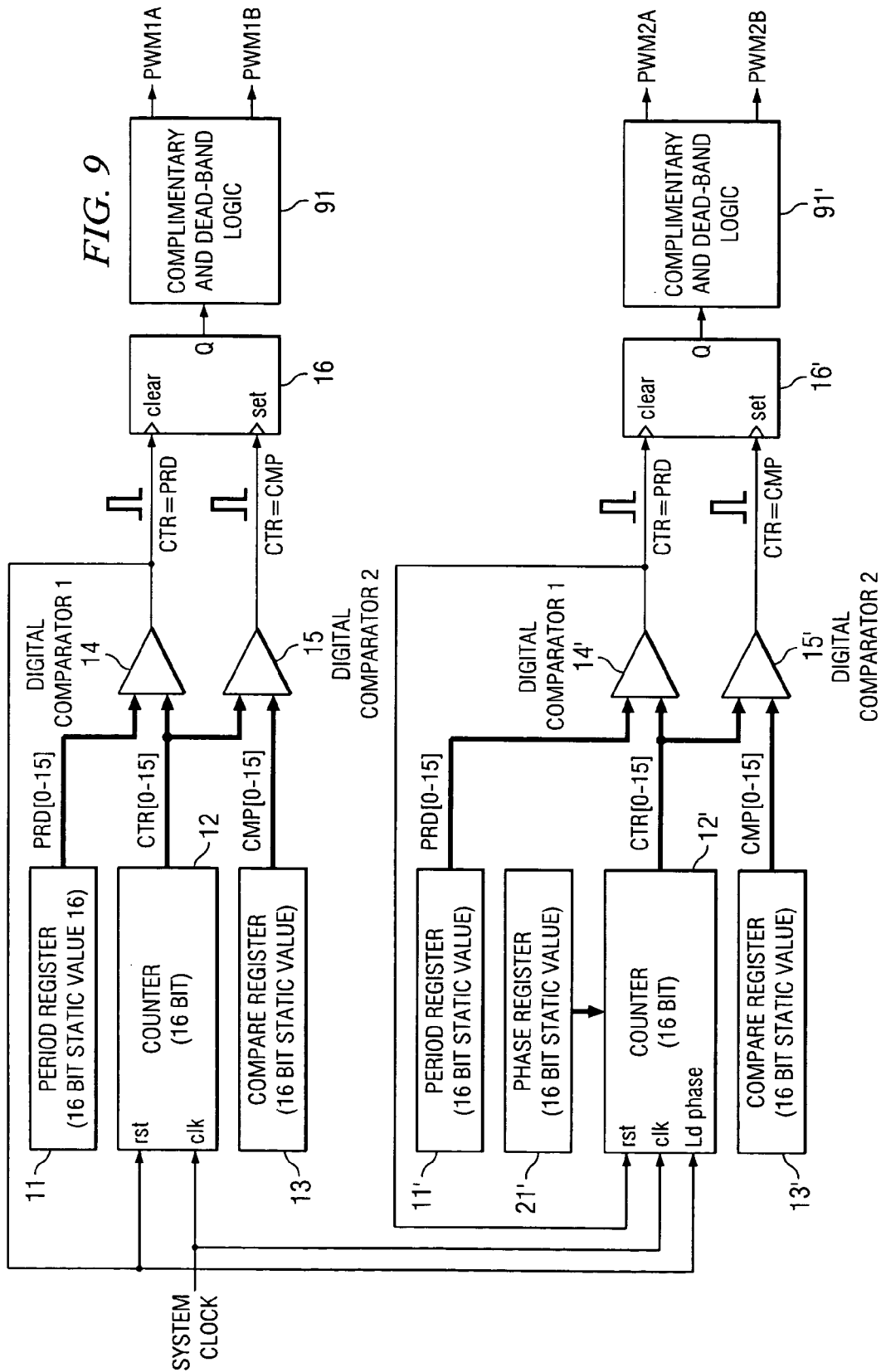
FIG. 9 is a two channel PWM generator with phase control capabilities according to the present invention.

Referring to FIG. 9, the apparatus for generating the PWM1A signals, the PWM1B signals the PWM2A signals and the PWM2Bsignals. The circuit is similar to the circuit in FIG. 5, except that two instead of three PWM generators are used. In addition, the signals from the Q-gates 16 and 16' are applied to complementary dead-band logic units 91 and 91'. From the output signal of Q-gate 16, the complementary dead-band logic unit 91 generates the PWM1A signal and the PWM1B signal. From the output signal of the Q-gate 16', the complementary dead-band logic unit provides the PWM2A signal and the PWM2B signals.

Figure 10:
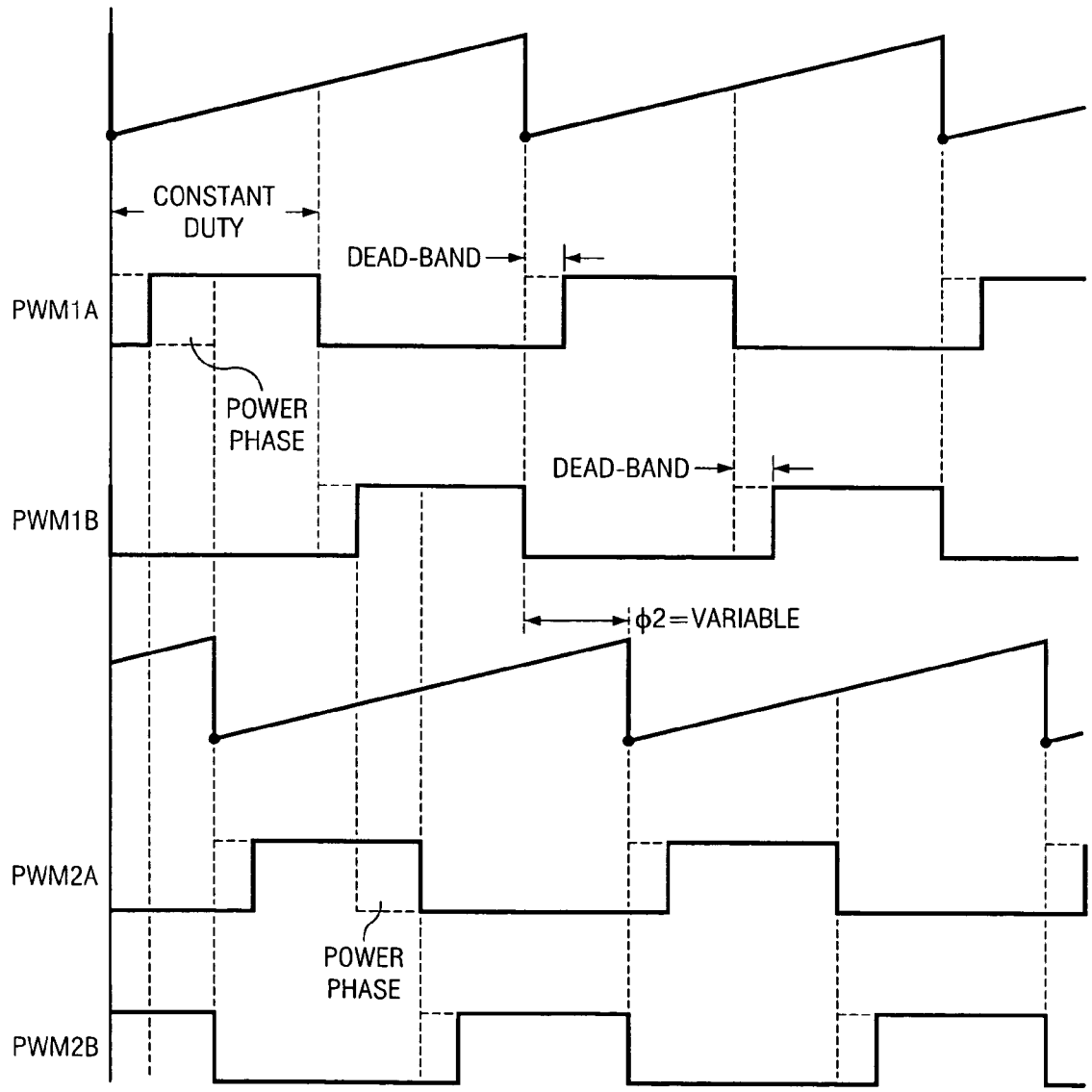
FIG. 10 illustrates a timing diagram for PWM control of a zero voltage switched full bridge circuit according to the present invention.

Referring to FIG. 10, the timing diagrams for the waveforms generated by PWM generator system of FIG. 9 are illustrated. The saw-tooth waveforms illustrate the time bases for the two PWM generators provided by the counters associated with each PWM generator. These waveforms are out of phase (i.e. Φ2 in the Figure) by an amount determined by the count in the phase register of the second PWM generator. The dead-band delays before the generation of the PWM signals is provided by the complementary dead-band logic units providing the output PWM signals. The complementary dead-band logic units are standard logic blocks which provide some gap time separation between PWMs controlling upper and lower power switches within a phase or leg. These logic units are commonly available in MOSFET driver chips. The first two power phases are illustrated in FIG. 10.

2. Operation of the Preferred Embodiment

The PWM generator system shown in FIG. 4 was developed to be fabricated on a silicon chip together with a microprocessor or DSP core and any associated resources (memory, I/O, communications. etc.) needed to support the application. Consequently, all of the PWM generator's operating resources (period, duty cycle, phase Off-set, etc. can be made read/write addressable registers that are available to the microprocessor or DSP core under software control.

The typical 3-phase power system shown in FIG. 5 can be extended to multi-phase power systems. This system can be made to change the number of PWM generator units/channels. In addition, the phase "offset" between each reference generator output signals and the other generator output signals must be altered when the number of generators is changed. This capability is useful in scalable power stage wherein additional generators can be brought on-line to respond to increasing power demands. Each time an additional generator is brought on-line. The phase relationship must be re-calculated and the phase registers updated. Subsequently, the phase loading apparatus will ensure all generators are correctly synchronized.

While the invention has been described with respect to the embodiments set forth above, the invention is not necessarily limited to these embodiments. Accordingly, other embodiments, variations, and improvements not described herein are not necessarily excluded from the scope of the invention, the scope of the invention being defined by the following claims.

What is claimed is:

1. A digital PWM generator unit, the unit comprising;
   a counter responsive to a system clock, the counter providing a time base for PWM output signals;
   a first register having a first value stored therein;
   a first comparator, the first comparator having the first value applied to a first input terminal thereof and a count from the counter applied to a second input terminal thereof, a reset signal being generated by the first comparator when the first value and the count are equal; the reset signal setting the counter to zero;
   a second register having a second value stored therein;
   a second comparator, the second comparator having the count applied to a first input terminal and the second value applied to a second terminal, the second comparator providing a set signal when the count and the second value are equal; and
   a phase register coupled to the counter, the phase register having a third value stored therein; the third value over-writing the current counter value in response to a control signal.

2. The unit as recited in claim 1 wherein over-writing the contents of the counter changes the phase of the PWM output signals.

3. The unit as recited in claim 2 wherein the contents of phase register are determined by a software program.

4. A digital PWM generator system, the system comprising;
   a digital PWM generator unit, the unit including:
      a counter responsive to system clock signals, the counter providing a time base for PWM output signals; and
      a phase register coupled to the counter, the contents of the phase register over-writing the current counter value in response to a control signal; and
   a reference PWM generator unit coupled to the unit, the reference PWM generator unit not having a phase register coupled to the counter, the reference PWM generator unit providing the control signal to the counter of the first unit.

5. The system as recited in claim 4 wherein the contents of the phase register determine the phase relationship between an output signal of the unit and an output signal of the reference PWM generator unit.

6. The system as recited in claim 5 further comprising at least a second unit and a second counter, the second unit having a phase register coupled to the second counter, the second counter responsive to a control signal from the reference PWM generator unit to over-write the contents of the second unit counter with the contents of the coupled phase register.

7. The system as recited in claim 6 wherein the reference PWM generator unit, the first unit, and the second unit are part of multi-phase power stage.

8. The system as recited in claim 7 wherein the system can be dynamically reconfigured to remove and to add a PWM generator unit.

9. The system as recited in claim 5 wherein the reference PWM generator unit and the first unit form a zero voltage switched full power stage.

10. The method of controlling a phase of a first PWM generator unit, the method comprising:
    counting signals from a system clock in a counter unit;
    in a first comparator unit, generating a set signal when the count in the counter unit is equal to a first preselected value;
    in a second comparator unit, generating a reset signal when the count in the counter unit is equal to a second preselected value; and
    with a third value in a phase register coupled to the counter, over-writing the current contents of the counter unit in response to a control signal, the third value controlling the time between the set signal and the reset signal.

11. The method as recited in claim 10 further comprising controlling the phase of the first PWM generator unit relative to a reference PWM generator unit by not providing the reference PWM generator unit a phase register, the reference PWM generator unit generating the control signal.

12. The method as recited in claim 11 further comprising determining the third value of the phase register by a software program.

13. The method as recited in claim 12 wherein the reference PWM generator unit and the first unit form a zero voltage switched full power stage.

14. The method as recited in claim 12 further comprising:
    adding a second PWM generator unit; and
    controlling the phase of the second unit by a value stored in a second unit phase register for over-writing a second unit counter in response to a control signal.

15. The method as recited in claim 14 wherein the reference PWM generator unit, the first unit and the second unit form at least a part of a multi-phase power stage.

16. The method as recited in claim 15 further comprising:
    adding a PWM generator unit including a phase register to the power stage when power requirements for the power stage increase above a first predetermined level; and removing a PWM generator from the power stage when the power requirements for the power stage decrease below a second predetermined level.

17. A system including a plurality of digital PWM generator units, the units comprising:
- a counter responsive to a system clock, the counter providing a time base signal, one unit being designated as a reference unit;
- a phase register storing a phase value, the phase register coupled to the counter of each unit except the reference unit;
- a period register storing a value determining a unit reset point;
- a compare register storing value determining a unit set point; and
- an output unit responsive to the counter, the period register and the compare register, the output unit providing a periodic output signal;
- wherein the reference unit generates a control signal, the control signal causing the phase register value to overwrite a current counter value.

18. The system as recited in claim 17 wherein the phase register value determines the phase of the PWM generator unit output signals relative to output signals of the reference unit.

* * * * *